(12) United States Patent
Kang

(10) Patent No.: US 6,528,344 B2
(45) Date of Patent: Mar. 4, 2003

(54) CHIP SCALE SURFACE-MOUNTABLE PACKAGING METHOD FOR ELECTRONIC AND MEMS DEVICES

(75) Inventor: Seok-jin Kang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/886,286

(22) Filed: Jun. 22, 2001

(65) Prior Publication Data

US 2002/0001873 A1 Jan. 3, 2002

(30) Foreign Application Priority Data

Jun. 22, 2000 (KR) ........................................ 2000-34506

(51) Int. Cl.[7] ........................ H01L 21/44; H01L 21/30
(52) U.S. Cl. ........................ 438/106; 438/455; 438/459
(58) Field of Search ................................ 438/113, 106, 438/107, 110, 118, 121, 125, 455, 456, 459

(56) References Cited

U.S. PATENT DOCUMENTS

| | | | | |
|---|---|---|---|---|
| 5,605,489 A | * | 2/1997 | Gale et al. ..................... | 451/28 |
| 5,637,539 A | * | 6/1997 | Hofmann et al. ............. | 438/20 |
| 5,907,768 A | * | 5/1999 | Malta et al. ................. | 438/105 |
| 5,919,548 A | * | 7/1999 | Barron et al. ................ | 428/138 |
| 6,136,243 A | * | 10/2000 | Mehregany et al. ........ | 264/162 |
| 6,297,072 B1 | * | 10/2001 | Tilmans et al. ............. | 438/106 |

* cited by examiner

Primary Examiner—Kamand Cuneo
Assistant Examiner—Scott Geyer
(74) Attorney, Agent, or Firm—Burns, Doane, Swecker & Mathis, LLP

(57) ABSTRACT

A chip scale surface-mountable packaging method for electronic and micro-electro mechanical system (MEMS) devices is provided. The chip scale surface-mountable packaging method includes: (a) forming an interconnection and sealing pattern as a deep trench in one surface of a conductive cover substrate using semiconductor fabricating and micromachining techniques; (b) filling the trench as the pattern of the cover substrate with an insulating material such as glass or ceramic, and planarizing the surface of the cover to form a bonding pattern; (c) accurately aligning the cover substrate with a device substrate, in which electronic or MEMS devices are integrated, and bonding the cover substrate and the device substrate; (d) polishing the other surface of the cover substrate and forming an electrode pattern thereon; and (e) dicing the sealed and interconnected substrates to form a complete chip scale package. Thus, both sealing of the electronic or MEMS devices and their interconnection with external devices can be achieved at a wafer level.

10 Claims, 4 Drawing Sheets

14  14                                      14  14

CHIP SCALE SURFACE-MOUNTABLE PACKAGING METHOD FOR ELECTRONIC AND MEMS DEVICES

BACKGROUND OF THE INVENTION

1. Field of the Invention

The present invention relates to a chip scale surface-mountable packaging method for electronic and micro-electro mechanical system (MEMS) devices.

2. Description of the Related Art

A conventional wafer level chip scale package will be described with reference to FIG. 1. As shown in FIG. 1, an active region 4 in which a large number of integrated circuits are formed is located in a first substrate 1. A second substrate 2 serving as a cover for protecting the active region 4 is combined with the first substrate 1 while being supported by a frit glass wall 3. An external interconnect electrode 5 is arranged on the first substrate 1 but does not extend up to the surface of the second substrate 2. To install this type of chip package into a system for use, wire bonding is necessary. When a chip package is fabricated such that the capillary of a wire bonder does not reach the second substrate 2, there is a problem in that the size of individual chips increases. In addition, a flip chip bonding technique, which is widely used in surface mount packaging applied for the purpose of manufacturing miniature chips, cannot be applied to such a conventional package structure.

SUMMARY OF THE INVENTION

To solve the above-described problems, it is an object of the present invention to provide a method for fabricating a new chip scale surface-mountable package for a variety of electronic or micro-electro mechanical system (MEMS) devices, in which both electric and physical passivation and interconnection with external circuits can be achieved at a wafer level.

To achieve the object of the present invention, there is provided a chip scale surface-mountable packaging method for electronic and MEMS devices, comprising: (a) forming an interconnection and sealing pattern as a deep trench in one surface of a conductive cover substrate using semiconductor fabricating and micromachining techniques; (b) filling the trench as the pattern of the cover substrate with an insulating material such as glass or ceramic and planarizing the surface of the cover to form a bonding pattern; (c) accurately aligning the cover substrate with a device substrate, in which electronic or MEMS devices are integrated, and bonding the cover substrate and the device substrate; (d) polishing the other surface of the cover substrate and forming an electrode pattern thereon; and (e) dicing the sealed and interconnected substrates to form a complete chip scale package.

It is preferable that the cover substrate is formed as an impurity-doped conductive semiconductor substrate or a metal substrate having a processing suitability and a melting point higher than a predetermined temperature. It is preferable that, in step (a) of forming the interconnection and sealing pattern in the cover substrate, the deep trench has a depth of hundreds of micrometers.

It is preferable that the semiconductor substrate is formed of silicon (Si), and the metal substrate is formed of a metal selected from the group consisting of stainless steel, Kovar, and copper (Cu).

It is preferable that, in filling the trench of the cover substrate with ceramic in step (b), ceramic paste is coated on the surface of the cover substrate and packed into the trench of the cover substrate under pressure, and the resultant cover substrate is thermally processed in a furnace. It is preferable that planarizing the cover substrate in step (b) is performed using chemical mechanical polishing (CMP) to minimize surface roughness of the cover substrate and to expose the interconnection and bonding patterns of the cover substrate. It is preferable that step (c) is performed by a bonding method selected from the group consisting of solder bonding, eutectic bonding, zero gap bonding, anisotropic conductive film bonding, conductive epoxy bonding, and anodic bonding.

BRIEF DESCRIPTION OF THE DRAWINGS

The above object and advantages of the present invention will become more apparent by describing in detail a preferred embodiment thereof with reference to the attached drawings in which:

FIGS. 3A through 3H are sectional views of a single chip illustrating each step of the method for fabricating the chip package of FIG. 2 according to the present invention, in which FIG. 3A is a sectional view after photolithography and etching processes have been performed to form an interconnection and sealing pattern in a second substrate, FIG. 3B is a sectional view after binding a glass substrate and the second substrate or coating the second substrate with a sintering ceramic material has been performed, FIG. 3C is a vertical view after a thermal process in a high-temperature furnace has been performed to fill a trench formed in the second substrate with the ceramic material, FIG. 3D is a sectional view after chemical mechanical polishing has been performed on the top of the second substrate, FIG. 3E is a sectional view after a cavity region for packaging MEMS devices which need a vibration cavity has been selectively etched, and FIG. 3F is a sectional view after the electrode pattern of a first substrate, in which electronic or micro-electro mechanical system (MEMS) devices are integrated, has been accurately aligned with the interconnection and sealing pattern of the second substrate serving as a cover, and combined with the same, FIG. 3G is a sectional view after chemical mechanical polishing has been performed on the top of the second substrate combined with the first substrate, and FIG. 3H is a sectional view after an external connection electrode pattern has been formed on the second substrate.

DETAILED DESCRIPTION OF THE INVENTION

The structure of a chip package fabricated by a chip scale surface-mountable packaging method for electronic and micro-electro mechanical system (MEMS) devices according to the present invention will be described with reference to FIG. 2.

Figure 1:
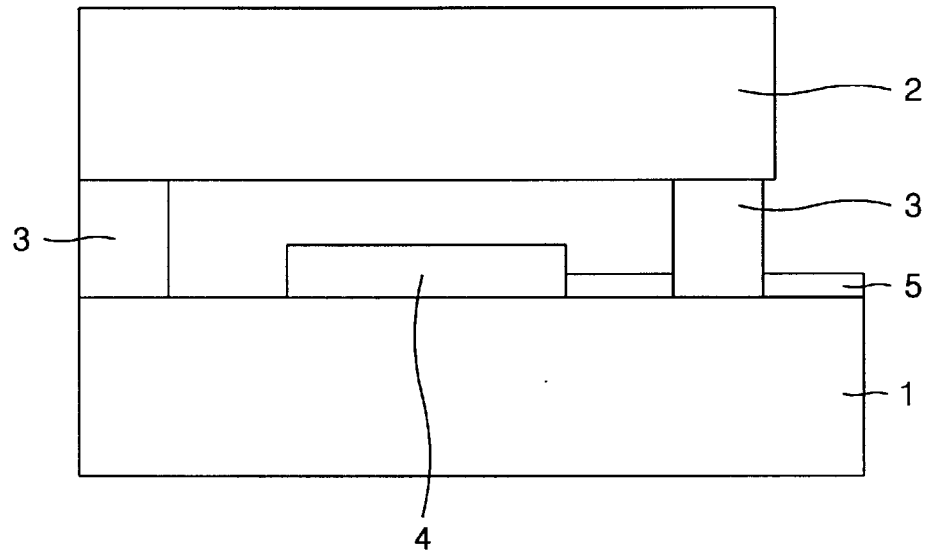
FIG. 1 is a sectional view of a conventional wafer level chip scale package.
Figure 2:
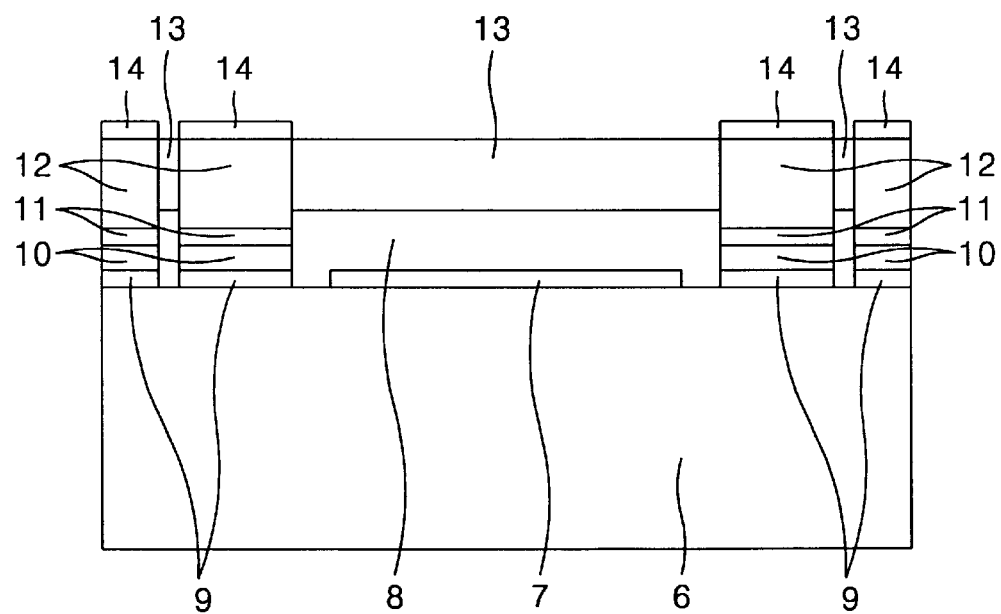
FIG. 2 is a sectional view of a chip package fabricated by a chip scale surface-mountable packaging method according to the present invention.

As shown in FIG. 2, an active region 7, in which a variety of devices are formed, exists in a first substrate 6 for devices (hereinafter, "first device substrate"). The first device substrate 6 is combined with a second substrate 12 serving as a cover (hereinafter, "second cover substrate"), which is filled with glass or ceramic 13, using a conductive bonding material layer 10. The second cover substrate 12 is formed of $n^+$-Si, $p^+$-Si, stainless steel, Kovar, or copper. The conductive bonding material layer 10 is formed of solder, gold (Au), anisotropic conductive film, or conductive epoxy. A cavity 8 is formed by the sealing. The first device substrate 6 and the second cover substrate 12 are combined such that individual device electrodes 9 formed on the first device substrate 6 with aluminum (Al) or Au are electrically connected with lower electrodes 11 formed on the second cover substrate 12 by the conductive bonding material layer 10. Reference numeral 14 denotes external interconnect electrodes formed of Al or Au, which are electrically connected with the individual device electrodes 9 through the second cover substrate 12.

The chip scale surface-mountable packaging method for electronic and MEMS devices according to the present invention will be described in greater detail with reference to FIGS. 3A through 3H. Although the sectional views of FIGS. 3A through 3H are illustrated for a single chip, tens to thousands of such chips are periodically arranged in the same substrate in an actual manufacturing process.

Figure 3A:
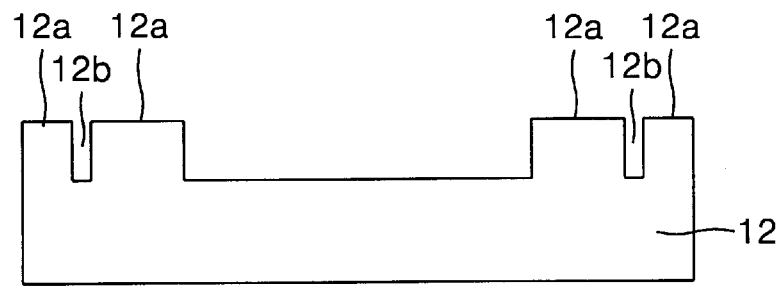

First, an interconnection and sealing pattern 12a is formed in the second cover substrate 12, which is conductive, using a semiconductor fabricating technique and micromachining technique. In particular, as shown in FIG. 3A, a deep trench 12b, which is as deep as hundreds of micrometers, is formed in the second cover substrate 12 by photolithography and etching processes to form an interconnection and sealing pattern 12a. Here, the second cover substrate 12 may be formed as a semiconductor substrate, such as an impurity-doped conductive silicon (Si) wafer, or a metal substrate having a good processing suitability and a melting point higher than a predetermined temperature. The metal substrate may be formed of stainless steel, Kovar (Fe-Ni alloy), or copper (Cu).

Figure 3B:
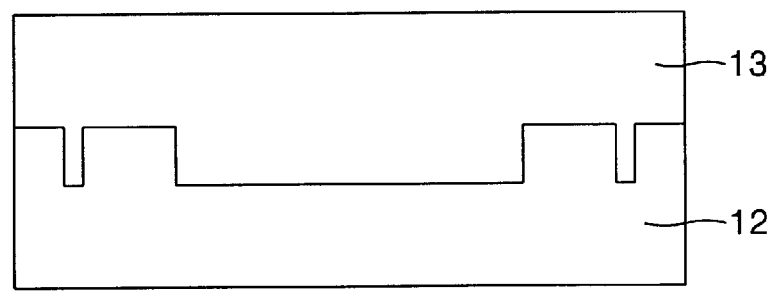
Figure 3C:
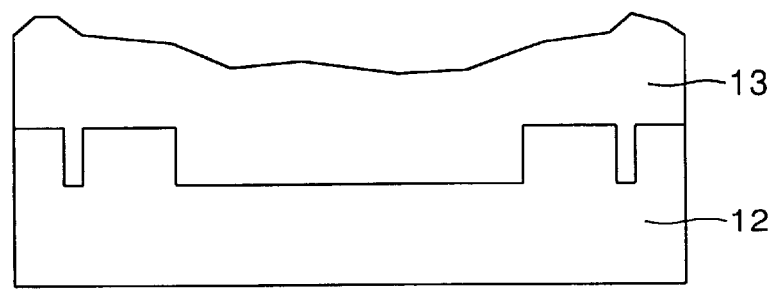
Figure 3D:
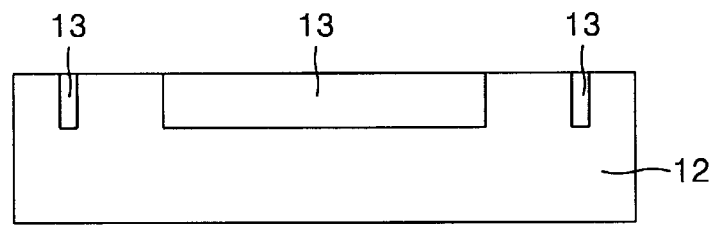

Next, the trench 12b of the second cover substrate 12 is filled with glass or ceramic material, the second cover substrate 12 is planarized by chemical mechanical polishing (CMP), and a metal thin film is deposited thereon and patterned. The process of filling the trench 12b of the second cover substrate 12 with a ceramic material is illustrated in FIG. 3B. After coating the surface of the second cover substrate 12 with a ceramic paste, pressure is applied to the second cover substrate 12 to allow the ceramic paste 13 to pack into the trench 12b formed in the second cover substrate 12, as shown in FIG. 3C. The resultant structure is thermally processed in a furnace. As a result, the trench 12b is fully filled. Following the process of filling the trench 12b of the second cover substrate 12, the second cover substrate 12 is planarized by CMP, as shown in FIG. 3D. This process is for minimizing the surface roughness of the second cover substrate 12 and exposing the interconnection and metal bonding patterns.

Figure 3E:
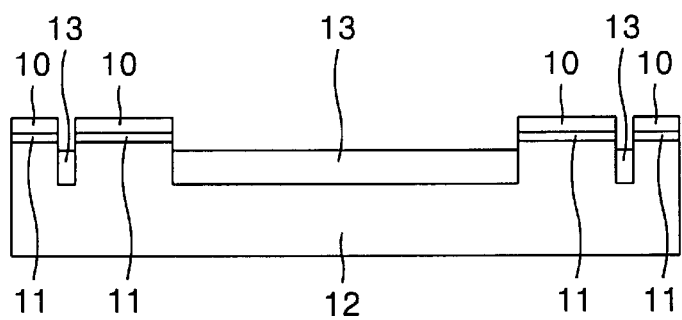

Following the planarization of the second cover substrate 12, a thin film is deposited on the second cover substrate 12 and patterned, as shown in FIG. 3E. In particular, Au or Al is deposited over the second cover substrate 12 and patterned so that a lower electrode 11 is formed on the interconnection and sealing pattern 12a of the second cover substrate 12. Next, a conductive bonding material layer 10 is formed thereon with solder, Au, anisotropic conductive film, or conductive epoxy.

Figure 3F:
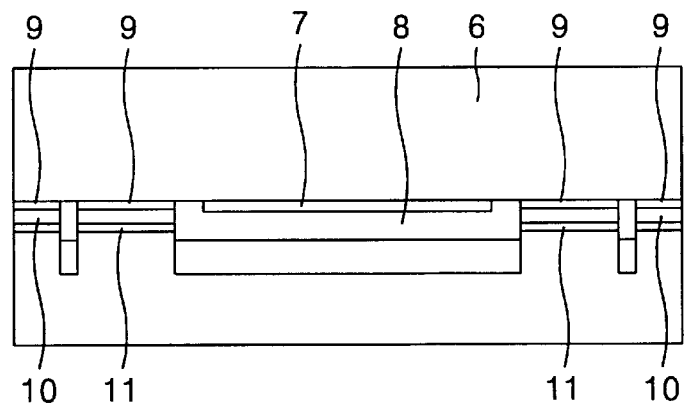

Next, as shown in FIG. 3F, the second cover substrate 12, and the first device substrate 6, in which electronic or MEMS devices are integrated, are accurately arranged and combined at a wafer level. The electrode and sealing pattern 9 of the first device substrate 12 in which electronic or MEMS devices are formed, is accurately aligned with the pattern, i.e., the conductive bonding material layer 10 and the lower electrode 11, of the second cover substrate 12, and then combined with the same. It is preferable that the sealing process is performed by solder bonding, eutectic bonding, zero gap bonding, anisotropic conductive film bonding, conductive epoxy bonding, or anodic bonding.

Figure 3G:
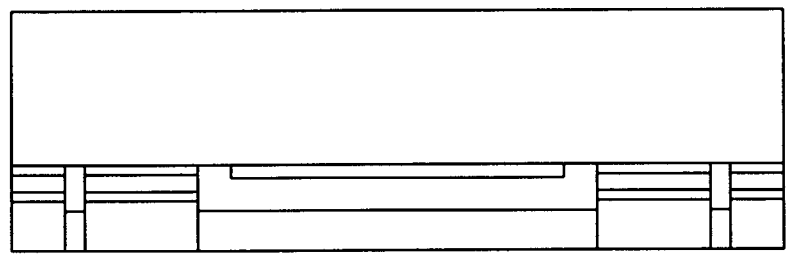
Figure 3H:
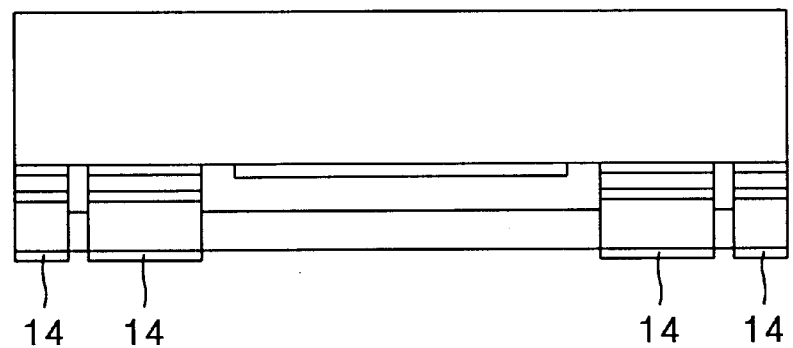

Following this, as shown in FIG. 3G, an opposing surface of the second cover substrate 12 is polished by CMP to expose glass or ceramic 13. An external interconnect electrode pattern 14 is formed on the polished surface of the second cover substrate 12, as shown in FIG. 3H. FIG. 3H is a sectional view after the external interconnect electrode pattern 14 has been formed on the second cover substrate 12. As shown in FIG. 3H, the external interconnect electrode pattern 14 is formed as the same level as the surface of the second cover substrate without a step, which is a surface-mountable package structure for flip chip bonding.

The sealed and interconnected substrates are diced into complete individual chip scale packages.

As described above, the chip scale package according to the present invention is based on the substrate planarizing technique by glass molding and ceramic filling. The principle of these techniques is as follows.

For the glass molding based substrate planarizing technique, a semiconductor or metal wafer (described as a second cover substrate above) having an interconnection and sealing structure is bonded with a glass substrate in a vacuum atmosphere. The reason why this process is performed under vacuum is that, if air remains in a deep trench of the substrate, the following molding process cannot be satisfactorily performed due to generation of air bubbles.

Next, the bonded substrates are put into a furnace and heated at a high temperature under atmospheric pressure to melt the glass so that the trench of the substrate is filled. Then, the temperature of the furnace is slowly dropped. After taking the resultant structure from the furnace, and the glass surface of the substrate is planarized by CMP.

For the ceramic based filling technique, ceramic paste is coated on the second cover substrate and pressure is applied to allow the ceramic paste to pack into the trench of the second cover substrate. Then, the surface of the substrate is planarized in the same manner applied after the glass molding process.

The chip scale surface-mountable packaging method according to the present invention described above has the following advantages.

First, although a deep and wide interconnection and sealing pattern is formed in a substrate, the external interconnect electrode can be formed on the same level as the surface of the substrate by the new substrate planarization method applied in the present invention, so the package can easily be mounted on the surface of an external printed circuit board (PCB) as a flip chip. Thus, the present invention can be applied all surface-mountable electronic and MEMS devices for a miniature system.

Second, the electrode formation and planarization techniques, as the base technique of the present invention, can be effectively used to overcome the limitation in the manufacture of MEMS having a similar structure.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A chip scale surface-mountable packaging method for electronic and micro-electro mechanical system (MEMS) devices, comprising:

(a) forming an interconnection and sealing pattern as a trench in one surface of a conductive cover substrate using semiconductor fabricating and micromachining techniques;

(b) filling the trench as the pattern of the cover substrate with an insulating material selected from the group consisting of glass and ceramic, and planarizing the surface of the cover substrate having the insulating material to form a bonding pattern;

(c) aligning the cover substrate with a device substrate, in which electronic or MEMS devices are integrated, and bonding the cover substrate and the device substrate; and (d) polishing the other surface of the cover substrate and forming an electrode pattern thereon.

2. The method of claim 1, wherein the cover substrate is formed as an impurity-doped conductive semiconductor substrate or a metal substrate.

3. The method of claim 2, wherein the semiconductor substrate is formed of silicon (Si), and the metal substrate is formed of a metal selected from the group consisting of stainless steel, Kovar, and copper (Cu).

4. The method of claim 2, wherein, in step (a) of forming the interconnection and sealing pattern in the cover substrate, the trench has a depth of more than two hundred and less than a thousand micrometers.

5. The method of claim 1, wherein, in filling the trench of the cover substrate with ceramic in step (b), ceramic paste is coated on the surface of the cover substrate and packed into the trench of the cover substrate, and the resultant cover substrate is thermally processed in a furnace.

6. The method of claim 1, wherein planarizing the cover substrate in step (b) is performed using chemical mechanical polishing (CMP) to minimize surface roughness of the cover substrate and to expose the interconnection and bonding patterns.

7. The method of claim 1, wherein, in filling the trench of the cover substrate having the interconnection and sealing pattern with glass in step (b), the cover substrate is bonded with a glass substrate in a vacuum and the resultant bonded substrates are processed in a furnace.

8. The method of claim 1, wherein step (c) is performed by a bonding method selected from the group consisting of solder bonding, eutectic bonding, zero gap bonding, anisotropic conductive film bonding, conductive epoxy bonding, and anodic bonding.

9. The method of claim 1, further comprising:

dicing the sealed and interconnected substrates to form a complete chip scale package.

10. The method of claim 1, wherein the trench is formed outside a cavity for containing electronic or MEMS devices.

* * * * *